(12) United States Patent
Shimizu

(10) Patent No.: US 9,232,644 B2
(45) Date of Patent: Jan. 5, 2016

(54) WIRING SUBSTRATE

(71) Applicant: SHINKO ELECTRIC INDUSTRIES CO., LTD., Nagano-shi, Nagano (JP)

(72) Inventor: Yuichiro Shimizu, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 198 days.

(21) Appl. No.: 14/032,592

(22) Filed: Sep. 20, 2013

(65) Prior Publication Data

US 2014/0083745 A1 Mar. 27, 2014

(30) Foreign Application Priority Data

Sep. 27, 2012 (JP) ................. 2012-213601

(51) Int. Cl.
| | |
|---|---|
| *H05K 1/11* | (2006.01) |
| *H05K 1/03* | (2006.01) |
| *H05K 1/09* | (2006.01) |
| *H05K 1/02* | (2006.01) |
| *H05K 3/46* | (2006.01) |
| *H05K 3/00* | (2006.01) |
| *H05K 3/38* | (2006.01) |
| *H05K 3/40* | (2006.01) |
| *H05K 3/42* | (2006.01) |

(52) U.S. Cl.
CPC .............. *H05K 1/0298* (2013.01); *H05K 3/389* (2013.01); *H05K 3/4652* (2013.01); *H05K 3/0035* (2013.01); *H05K 3/0038* (2013.01); *H05K 3/388* (2013.01); *H05K 3/4007* (2013.01); *H05K 3/427* (2013.01); *H05K 2201/096* (2013.01); *H05K 2203/1461* (2013.01)

(58) Field of Classification Search
CPC ......... H05K 1/0298; H05K 1/11; H05K 1/14; H05K 1/115; H05K 1/116; H05K 3/389; H05K 3/0035; H05K 3/388; H05K 3/4007; H05K 3/427; H05K 2201/096; H05K 2203/1461
USPC .................. 174/251, 255, 257, 262, 264–266
See application file for complete search history.

(56) References Cited

U.S. PATENT DOCUMENTS

| | | | |
|---|---|---|---|
| 6,197,688 B1 * | 3/2001 | Simpson ....................... 438/678 |
| 2002/0144775 A1 * | 10/2002 | Tung et al. .................. 156/303.1 |
| 2008/0012142 A1 * | 1/2008 | Mehta et al. .................. 257/762 |
| 2009/0218125 A1 * | 9/2009 | Nakai et al. ................... 174/263 |
| 2011/0049705 A1 * | 3/2011 | Liu et al. ....................... 257/737 |
| 2012/0085730 A1 * | 4/2012 | Sasaki et al. .................... 216/13 |

FOREIGN PATENT DOCUMENTS

| | | |
|---|---|---|
| JP | 61-113296 A | 5/1986 |
| JP | 2002-252459 A | 9/2002 |
| JP | 2009-188429 A | 8/2009 |

* cited by examiner

*Primary Examiner* — Sherman Ng
(74) *Attorney, Agent, or Firm* — Drinker Biddle & Reath LLP

(57) ABSTRACT

There is provided a wiring substrate. The wiring substrate includes: a first wiring layer; a first insulating layer on the first wiring layer; a first coupling agent layer on the first insulating layer; a first copper/tin alloy layer on the first coupling agent layer; a first via hole formed through the first copper/tin alloy layer, the first coupling agent layer, and the first insulating layer to reach the first wiring layer; a metal catalyst provided on only a sidewall of the first via hole; a seed layer provided on the metal catalyst and formed only on the sidewall of the first via hole; and a metal plating layer formed on the first copper/tin alloy layer and the seed layer and filled in the first via hole to contact the first wiring layer.

4 Claims, 17 Drawing Sheets

(PARTIALLY ENLARGED VIEW)

WIRING LAYER (50)
WITH EXTENDING WIRING PORTION
(PARTIALLY ENLARGED PLAN VIEW (1))

WIRING LAYER (50) IS FORMED AS
ISLAND-SHAPED PAD
(PARTIALLY ENLARGED PLAN VIEW (2))

WIRING SUBSTRATE

This application claims priority from Japanese Patent Application No. 2012-213601, filed on Sep. 27, 2012, the entire contents of which are herein incorporated by reference.

BACKGROUND OF THE INVENTION

1. Technical Field

The present disclosure relates to a wiring substrate on which an electronic component such as a semiconductor chip is mounted.

2. Description of the Related Art

In the related art, there is a wiring substrate on which an electronic component such as a semiconductor chip is mounted. In an example of the wiring substrate, a built-up wiring layer is formed on one surface or both surfaces of a core substrate according to a semi-additive method.

In recent years, a narrower pitch of a wiring layer of the wiring substrate has been developed according to high performance of an electronic component such as a semiconductor chip (see e.g., JP-A-61-113296, JP-A-2002-252459 and JP-A-2009-188429).

As described in the following section of preliminary matters, in a case of forming a multilayer wiring structure using the semi-additive method, a surface of an insulating resin layer is roughened by etching when a desmear process is performed on the inside of a via hole. Thus, a wiring layer can be formed on the insulating resin layer with good adhesion due to an anchor effect.

In recent years, there has been a demand for making a wiring layer finer in a wiring substrate according to miniaturization and high performance of a semiconductor chip.

If a surface of an insulating resin layer is uneven, particularly, if a pitch of a wiring layer is narrowed, a residue tends to occur when a seed layer is etched, and thus wiring layers are easily electrically short-circuited to each other. In addition, there is a problem in that a transmission loss of a high frequency signal tends to occur in a wiring layer formed on the uneven insulating resin layer.

As such, in the method of roughening the surface of the insulating resin layer so as to secure adhesion of the wiring layer with respect to the insulating resin layer, it is difficult to form a wiring layer having the line width of 10 μm or less with high reliability, and a technique is required in which a fine wiring layer is formed on a smooth resin layer with good adhesion.

SUMMARY OF THE INVENTION

According to one or more aspects of the present invention, there is provided a wiring substrate. The wiring substrate comprises: a first wiring layer; a first insulating layer on the first wiring layer; a first coupling agent layer on the first insulating layer; a first copper/tin alloy layer on the first coupling agent layer; a first via hole formed through the first copper/tin alloy layer, the first coupling agent layer, and the first insulating layer to reach the first wiring layer; a metal catalyst provided on only a sidewall of the first via hole; a seed layer provided on the metal catalyst and formed only on the sidewall of the first via hole; and a metal plating layer formed on the first copper/tin alloy layer and the seed layer and filled in the first via hole to contact the first wiring layer.

DETAILED DESCRIPTION

Figure 1A:
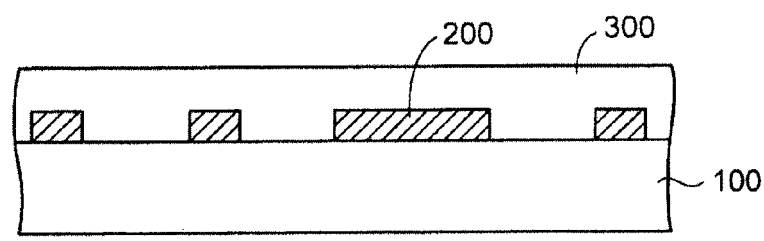
FIGS. 1A to 1C are cross-sectional views for describing preliminary matters.

Hereinafter, exemplary embodiments of the present invention will be now described with reference to the drawings. In each drawing, the same reference numeral is attached to the same component, and the overlapped descriptions may be omitted.

Before description of the present embodiment, preliminary matters which form a basis of the present invention will be described. FIGS. 1A to 2C are cross-sectional views for describing the preliminary matters.

As shown in FIG. 1A, first, a wiring layer 200 made of copper is formed on a core substrate 100, and then an insulating resin layer 300 which covers the wiring layer 200 is formed on the core substrate 100.

Figure 1B:
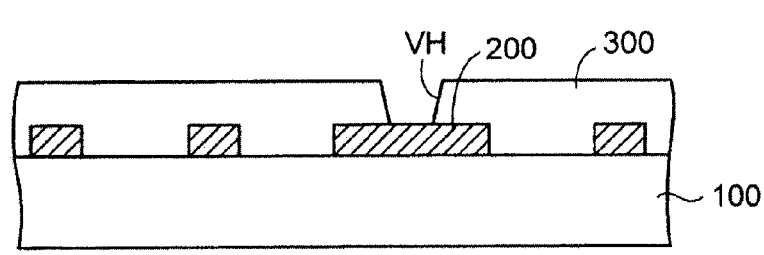

Next, as shown in FIG. 1B, the insulating resin layer 300 is processed with a laser so as to form a via hole VH which reaches a connection portion of the wiring layer 200.

Figure 1C:
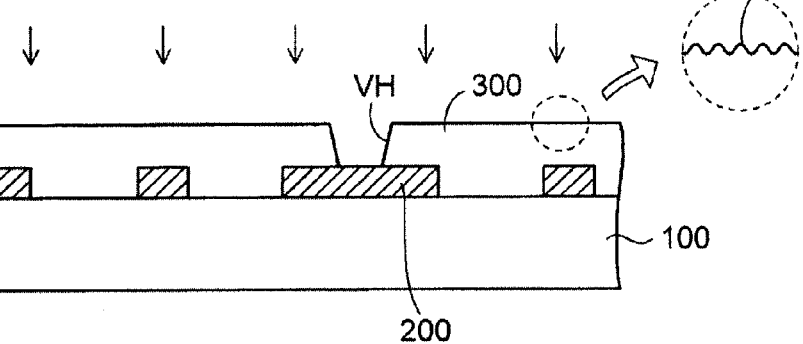

In addition, as shown in FIG. 1C, a desmear process is performed on inside of the via hole VH by using a permanganate method. Thus, a resin smear or the like remaining in the via hole VH is removed and thus the inside of the via hole VH is cleaned. The surface of the insulating resin layer 300 is also etched through the desmear process and becomes a rough surface A. The surface roughness (Ra) of the rough surface A of the insulating resin layer 300 is 300 nm or more.

Figure 2A:
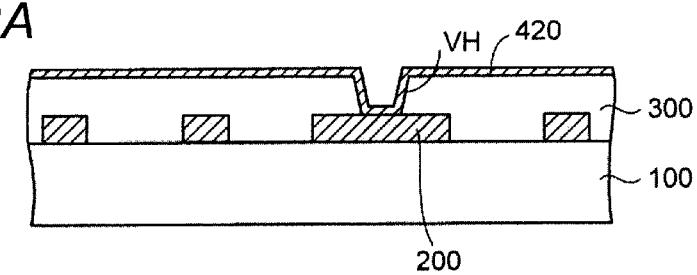
FIGS. 2A to 2C are cross-sectional views for describing preliminary matters.
Figure 2B:
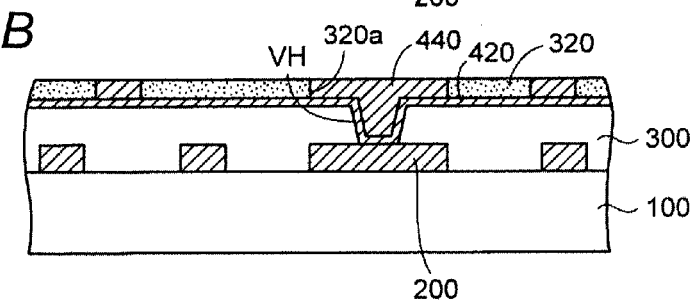

Successively, as shown in FIG. 2A, a seed layer 420 made of copper is formed on the insulating resin layer 300 and in the via hole VH through electroless plating. Next, as shown in FIG. 2B, a plating resist 320 having an opening 320a is formed on the seed layer 420 such that the opening 320a corresponds to a portion where a wiring layer 400 is to be provided.

Further, a metal plating layer 440 made of copper is formed in the opening 320a of the plating resist 320 through electrolytic plating using the seed layer 420 as a plating power supply layer.

Figure 2C:
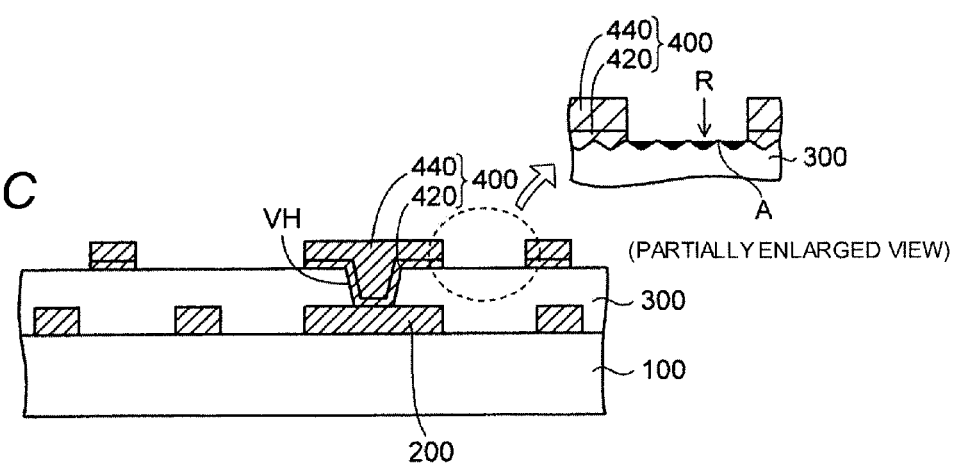

Next, as shown in FIG. 2C, after the plating resist 320 is removed, the seed layer 420 is etched using the metal plating layer 440 as a mask. Thus, the wiring layer 400 formed of the seed layer 420 and the metal plating layer 440 is formed on the insulating resin layer 300. The wiring layer 400 is electrically connected to the connection portion of the wiring layer 200 through the via hole VH (a via conductor).

In this case, as shown in the partially enlarged view of FIG. 2C, the surface of the insulating resin layer 300 becomes a rough surface A and is relatively considerably uneven, and thus an etching residue R tends to occur in the rough surface A when the seed layer 420 is etched, and also wirings are easily electrically short-circuited to each other.

In addition, if an overetching amount increases so as to completely remove the etching residue R of the seed layer 420, particularly, in a fine pattern having the line width of 10 μm or less, the pattern may disappear due to side etching.

Further, since the wiring layer 400 is formed on the rough surface A (unevenness) of the insulating resin layer 300, a transmission loss of a high frequency signal tends to occur due to influence of the unevenness, and thus it is difficult to make a wiring substrate for mounting a high performance semiconductor chip.

In the embodiment described below, the above-described defects can be removed.

(Embodiment)

Figure 15A:
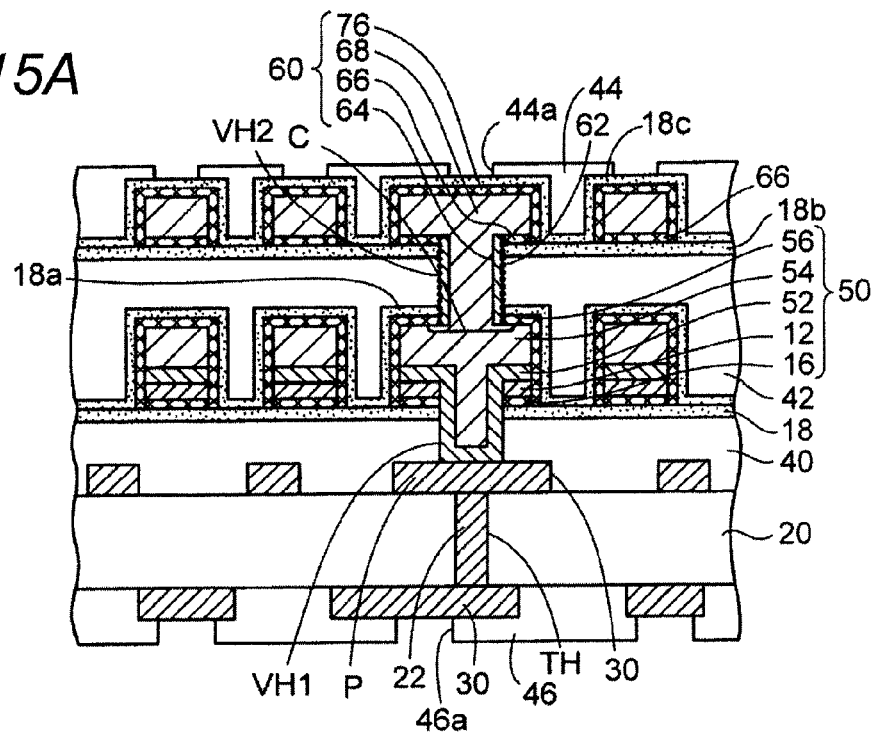
FIGS. 15A and 15B are cross-sectional views illustrating the manufacturing method of the wiring substrate according to the embodiment.
Figure 15B:
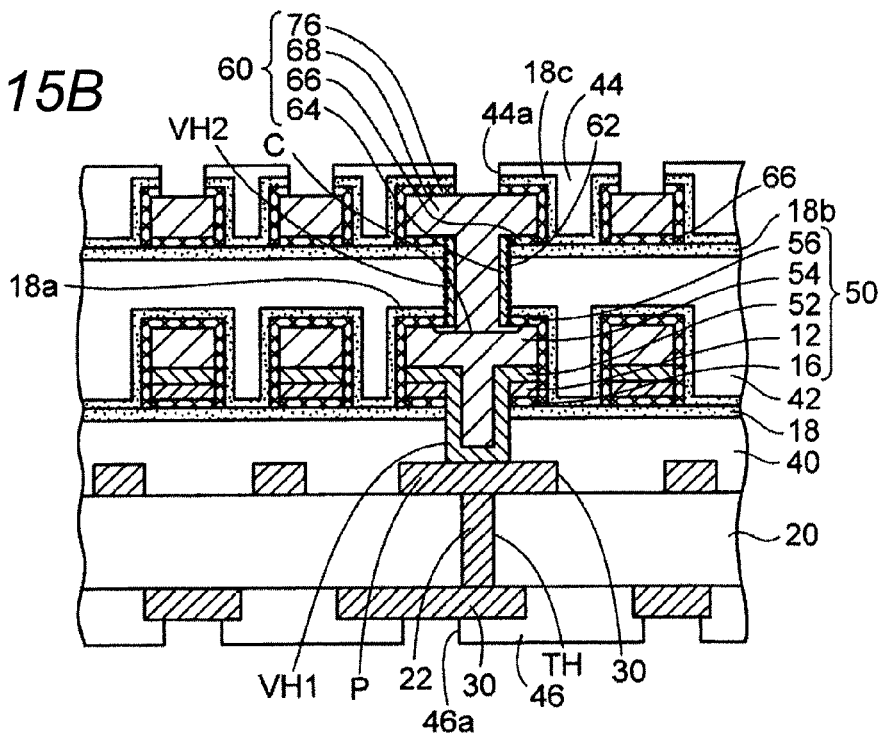
Figure 16:
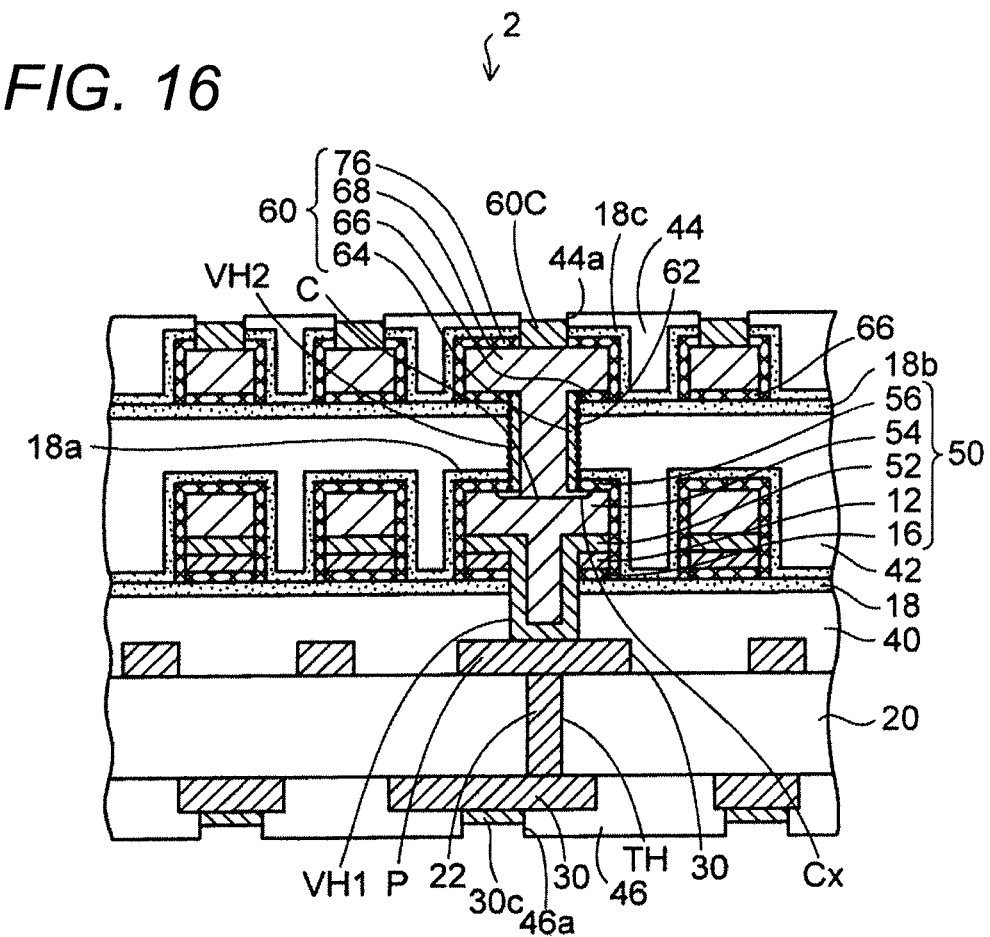
FIG. 16 is a cross-sectional view illustrating the wiring substrate according to the embodiment.

FIGS. 3A to 3E are cross-sectional views illustrating a manufacturing method of a metal layer transfer base material according to the embodiment, FIG. 4A to FIG. 15B are cross-sectional views illustrating a manufacturing method of a wiring substrate according to the embodiment, and FIG. 16 is a cross-sectional view illustrating a wiring substrate according to the embodiment.

First, a description will be made of a manufacturing method of a metal layer transfer base material used for a manufacturing method of a wiring substrate according to the embodiment.

Figure 3A:
FIGS. 3A to 3E are cross-sectional views illustrating a manufacturing method of a metal layer transfer base material used in an embodiment of the present invention.

As shown in FIG. 3A, first, a support body 10 is prepared. As the support body 10, a polyethylene terephthalate (PET) film, a polyethylene naphthalate (PEN) film, an LCP resin (liquid crystal polymer) film, a glass substrate, an SUS (stainless) substrate, or the like is used. In a case of using the PET film, the thickness thereof is 10 μm to 200 μm.

Any materials including organic, inorganic and metal materials may be used as a material of the support body 10.

The support body 10 is used as a temporary substrate supporting a thin metal layer, and is separated from the metal layer so as to be removed later. For this reason, a release agent made of silicone is coated on the surface of the support body 10. In a case where the support body 10 is made of a fluororesin, the release agent may be omitted.

Figure 3B:
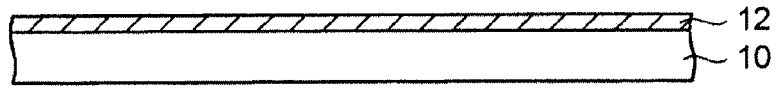

Next, as shown in FIG. 3B, a copper (Cu) layer 12 is formed on the support body 10 by using a sputtering method, a deposition method, an ion plating method, a CVD method, or the like. The thickness of the copper layer 12 is set to 10 nm to 5000 nm, and, preferably 100 nm to 1000 nm.

Figure 3C:
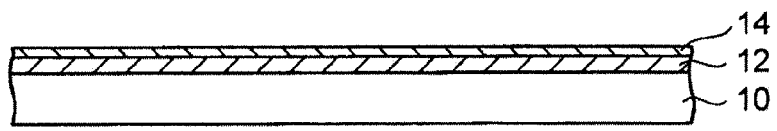

Successively, as shown in FIG. 3C, a tin (Sn) layer 14 is formed on the copper layer 12 by using a sputtering method, a deposition method, an ion plating method, a CVD method, a chemical plating method, an electrolytic plating method, or the like. The thickness of the tin layer 14 is set to 1 nm to 1000 nm, and, preferably 10 nm to 100 nm.

Figure 3D:
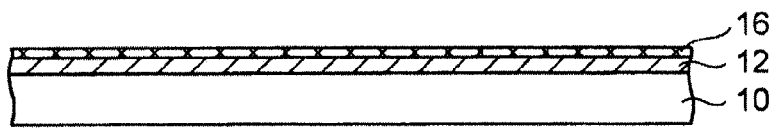

In addition, as shown in FIG. 3D, the structure of FIG. 3C is heated at temperature of about 100° C. to 150° C. so as to diffuse the copper from the copper layer 12 to the tin layer 14 and to alloy the tin layer 14, thereby forming a copper/tin alloy layer 16.

Further, in a case where a stage on which the support body 10 is placed is heated at about 100° C. according to a sputtering method, the tin layer 14 is formed so as to obtain the copper/tin alloy layer 16.

Furthermore, the thickness of the tin layer 14 is preferably adjusted such that the entire tin layer 14 is alloyed.

Alternatively, the copper/tin alloy layer 16 may be directly formed on the copper layer 12 according to a sputtering method using a composite target formed by an copper/tin alloy.

In a case where the copper/tin alloy layer 16 is obtained after the tin layer 14 is formed, the entire tin layer 14 may become the copper/tin alloy layer 16, or a main portion of the tin layer 14 may become the copper/tin alloy layer 16 and the tin layer 14 which is not alloyed may be remained on a portion of the surface side.

In addition, the tin layer 14 which is not alloyed on the surface side may be selectively removed through wet etching with respect to the copper/tin alloy layer 16. Thus, it is possible to uniformly form the very thin copper/tin alloy layer 16 on the support body 10.

Alternatively, the tin layer 14 may become the copper/tin alloy layer 16 in a heating process when a coupling agent layer described later is formed.

In addition, in forming the tin layer 14 or the copper/tin alloy layer 16, a metal such as silver (Ag), nickel (Ni), bismuth (Bi), or indium (In) may be included therein. For example, in a case where the tin layer 14 is formed using chemical plating, silver (Ag) may be added to the tin layer 14 in order to prevent the occurrence of whisker (needle-shaped metallic crystal).

In this way, a structure is prepared in which the copper layer 12 and the copper/tin alloy layer 16 are formed in this order in a detachable state on the support body 10.

Figure 3E:
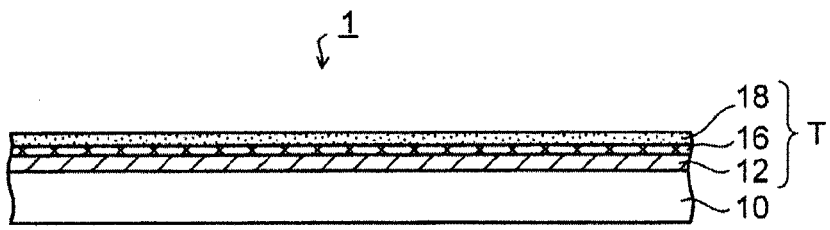

Next, as shown in FIG. 3E, a coupling agent layer 18 is formed on the copper/tin alloy layer 16. The coupling agent layer 18 has two functional groups having different reactivities in a single molecule, and there is a silane coupling agent as an example.

In the silane coupling agent, a functional group which chemically bonds with an organic material such as a resin preferably includes an amino group, an epoxy group, a mercapto group, an isocyante group, a methacryloxy group an acryloxy group, an ureide group, or a sulfide group. An optimal functional group is selected according to the kind of resin which chemically bonds with the silane coupling agent.

In addition, in the silane coupling agent, a functional group which chemically bonds with an inorganic material such as metal preferably includes a silanol group, a methoxy group, or an ethoxy group. An optimal functional group is selected according to the kind of metal which chemically bonds with the silane coupling agent.

In addition, a titanium coupling agent may be used as the coupling agent layer 18 in addition to the silane coupling agent.

The support body 10 on which the above-described copper layer 12 and copper/tin alloy layer 16 are formed may be immersed into a dilute solution of the silane coupling agent so as to contact therewith and may be then dried, so as to form the coupling agent layer 18 on the surface of the copper/tin alloy layer 16 through dehydration condensation.

The concentration of the dilute solution of the silane coupling agent is set to 0.1% to 10%, and, preferably 0.5% to 5%. In addition, the silane coupling agent is dried under a condition of treatment time: one to sixty minutes at an atmosphere of temperature of 80° C. to 150° C.

In addition to the method of immersing the support body 10 into a dilute solution of the silane coupling agent, the silane coupling agent may be formed on the copper/tin alloy layer 16 on the support body 10 through spray coating or deposition.

One functional group (a silanol group or the like) for bonding with an inorganic material of the coupling agent layer 18 chemically bonds with the copper/tin alloy layer 16 such that the coupling agent layer 18 is tightly adhered to the copper/tin alloy layer 16.

Through the above-described procedures, a metal layer transfer base material 1 according to the embodiment is obtained. A transfer layer T in which the copper layer 12, the copper/tin alloy layer 16, and the coupling agent layer 18 are formed in this order in a detachable state is formed on the support body 10 in the metal layer transfer base material 1.

In the metal layer transfer base material 1 according to the embodiment, the transfer layer T having a structure in which the coupling agent layer 18 is adhered onto the copper/tin alloy layer 16 with a uniform thickness can be formed on the support body 10 with high reliability.

Next, a description will be made of a method of transferring the transfer layer T (the copper layer 12, the copper/tin alloy layer 16, and the coupling agent layer 18) of the metal layer transfer base material 1 according to the embodiment onto an insulating resin layer of the wiring substrate.

Figure 4A:
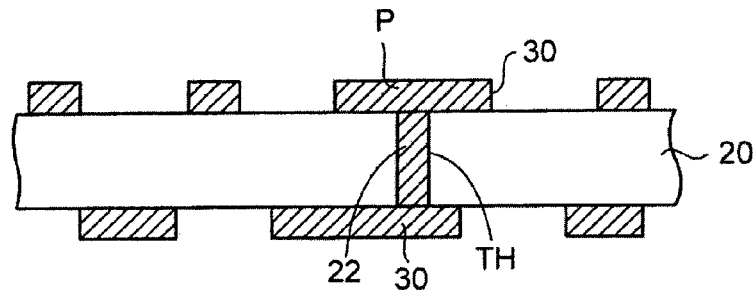
FIGS. 4A to 4C are cross-sectional views illustrating a manufacturing method of a wiring substrate according to the embodiment.

As shown in FIG. 4A, first, a core substrate 20 is prepared in which lower wiring layers 30 are respectively formed on both surface sides thereof. A through hole TH which penetrates in the thickness direction is provided in the core substrate 20, and a through electrode 22 fills the through hole TH. The lower wiring layers 30 on both surface sides are connected to each other via the through electrode 22. A connection pad P is shown in the lower wiring layer 30 on the upper surface side.

Alternatively, the lower wiring layers 30 on both surface sides of the core substrate 20 may be connected to each other via a through hole plating layer formed on the inner wall of the through hole TH, and a resin may fill the hole of the through hole TH.

The core substrate 20 is made of an insulating material such as a glass epoxy resin or silicon, and an insulating layer such as a silicon oxide layer is formed on both surface sides of the core substrate 20 and the inner surface of the through hole TH in a case of using a silicon substrate as the core substrate 20.

Although built-up wiring layers connected to the lower wiring layers 30 are respectively formed on both surface sides of the core substrate 20, the built-up wiring layers are formed only on the upper surface side of the core substrate 20 in the present embodiment.

Figure 4B:
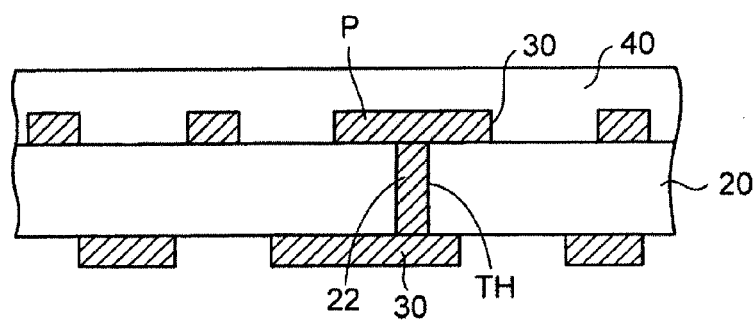

Next, as shown in FIG. 4B, a resin film in a semi-cured state (B stage) is formed on the core substrate 20 by a vacuum laminator so as to form a insulating resin layer 40 which covers the lower wiring layer 30 thereon.

A thermosetting resin such as an epoxy resin or a polyimide resin is used as the insulating resin layer 40. At this time, the insulating resin layer 40 is not cured but is in a semi-cured state (B stage).

Figure 4C:
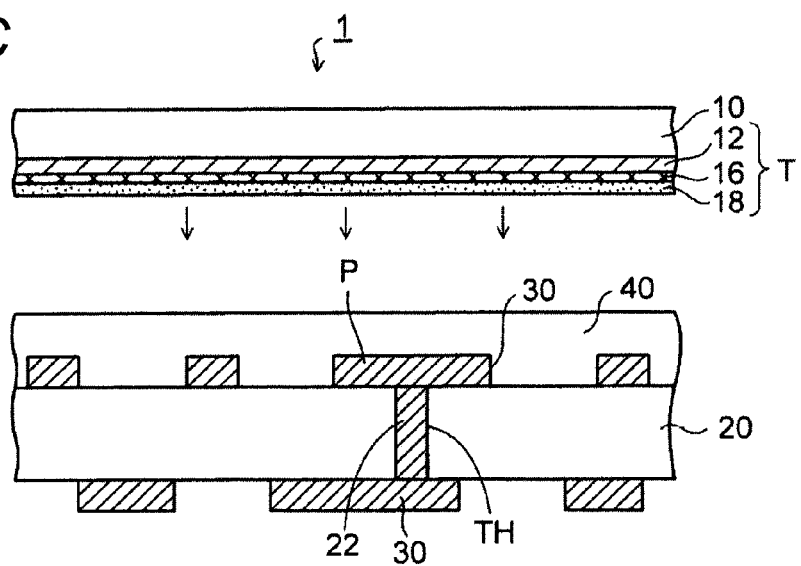

Next, as shown in FIG. 4C, the above-described metal layer transfer base material 1 (FIG. 3E) is turned upside down, and the surface of the coupling agent layer 18 of the metal layer transfer base material 1 is provided on the insulating resin layer 40 by a vacuum laminator.

Figure 5A:
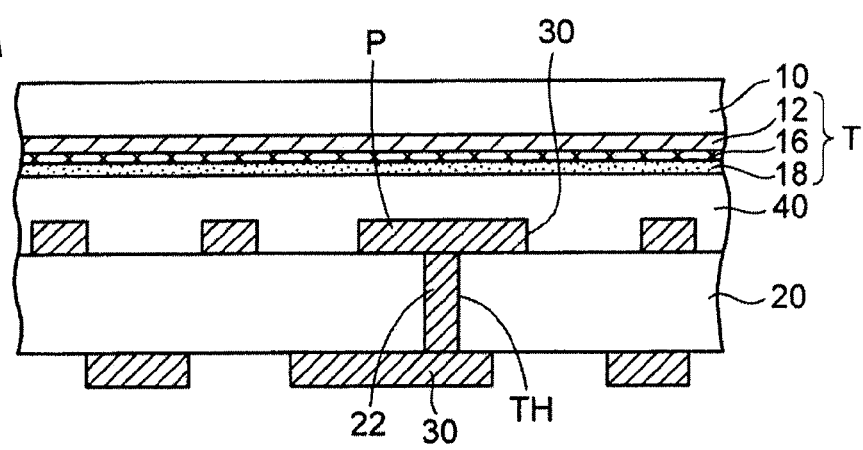
FIGS. 5A and 5B are cross-sectional views illustrating the manufacturing method of the wiring substrate according to the embodiment.

Next, as shown in FIG. 5A, the insulating resin layer 40 in a semi-cured state is completely cured through a heating process. In a case where the insulating resin layer 40 is made of an epoxy resin, the heating process is performed at temperature of 150° C. to 190° C.

Therefore, the coupling agent layer 18 of the metal layer transfer base material 1 is adhered to the insulating resin layer 40. The other functional group (an amino group or the like) for bonding with an organic material of the coupling agent layer 18 chemically bonds with the insulating resin layer 40, and thus the coupling agent layer 18 is tightly adhered to the insulating resin layer 40.

Thus, the copper/tin alloy layer 16 is tightly adhered to the insulating resin layer 40 via the coupling agent layer 18.

Figure 5B:
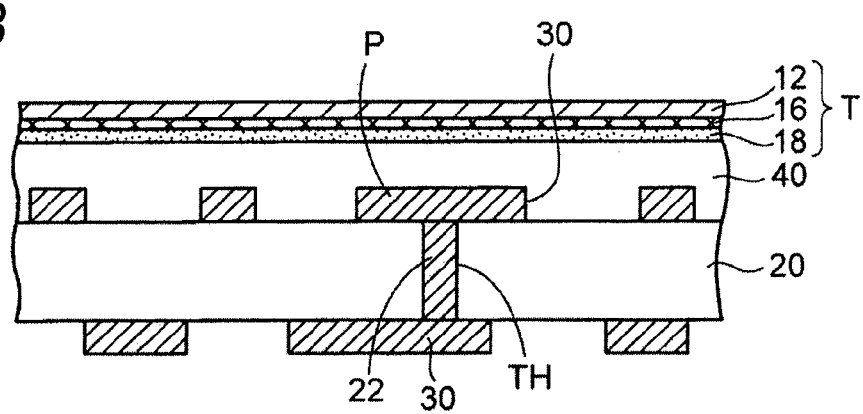

Successively, as shown in FIG. 5B, the support body 10 is detached from the interface with the copper layer 12 so as to expose the upper surface of the copper layer 12. In this case, the release agent is formed between the support body 10 and the copper layer 12, and thus the support body 10 can be easily removed by being pulled. Thus, the transfer layer T of the metal layer transfer base material 1 is transferred and is formed on the insulating resin layer 40.

In this way, a layered structure is obtained in which the coupling agent layer 18, the copper/tin alloy layer 16, and the copper layer 12 are disposed in this order on the insulating resin layer 40 which covers the lower wiring layer 30.

Since the insulating resin layer 40 is covered by the copper layer 12 or the like before the desmear process and is protected, the upper surface of the insulating resin layer 40 is maintained in a smooth state. The surface roughness (Ra) of the smooth insulating resin layer 40 is 10 nm to 200 nm.

The copper/tin alloy layer 16 is adhered to the insulating resin layer 40 (an epoxy resin or the like) via the coupling agent layer 18 (the silane coupling agent) with high reliability. By using the method of transferring the transfer layer T of the metal layer transfer base material 1 according to the present embodiment, the insulating resin layer 40 and the copper/tin alloy layer 16 can be adhered to each other via the coupling agent layer 18 with high reliability.

Unless there is a particular problem, the coupling agent layer 18 may be directly formed on the insulating resin layer 40, and the copper/tin alloy layer 16 and the copper layer 12 may be formed thereon according to a sputtering method.

Figure 6A:
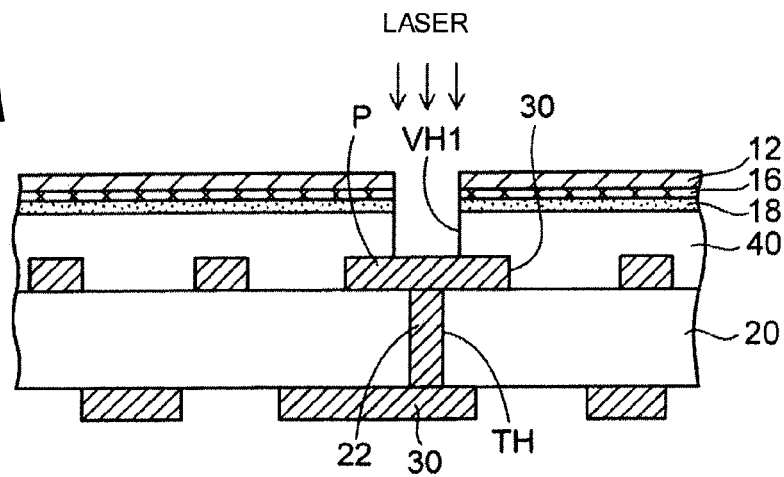
FIGS. 6A and 6B are cross-sectional views illustrating the manufacturing method of the wiring substrate according to the embodiment.

Subsequently, as shown in FIG. 6A, the copper layer 12, the copper/tin alloy layer 16, the coupling agent layer 18, and the insulating resin layer 40 are processed using a laser in the thickness direction, so as to form a via hole VH1 which reaches the connection pad P of the lower wiring layer 30. The laser processing is performed using a carbon dioxide layer or a UV-YAG laser.

Figure 6B:
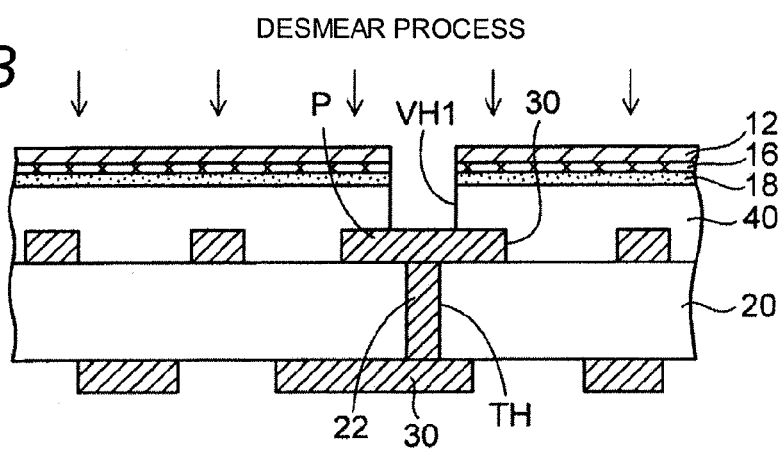

In addition, as shown in FIG. 6B, a desmear process is performed on inside of the via hole VH1 using a wet process such as a permanganate method. Thus, a resin smear or the like remaining in the via hole VH1 is removed and thus the inside of the via hole VH1 is cleaned.

Further, at this time, the release agent attached to the copper layer 12 is also removed.

In this case, since the copper layer 12 is scarcely etched and the insulating resin layer 40 is protected by the copper layer 12 in the desmear process using the permanganate method, the surface of the insulating resin layer 40 is not roughened due to the desmear process. Therefore, the surface of the insulating resin layer 40 is maintained in a smooth state (surface roughness (Ra): 10 nm to 200 nm).

In addition, since the sidewall of the via hole VH1 is roughened due to the desmear process, a seed layer described later is formed in the via hole VH1 with good adhesion.

Although a wet process such as the permanganate method is exemplified as the desmear process, the desmear process may be performed using plasma (dry process) of a gas including a fluorine atom such as $CF_4/O_2$ base. Also in the desmear process using a dry process, since the copper layer 12 is scarcely etched and the insulating resin layer 40 is protected by the copper layer 12, the surface of the insulating resin layer 40 is not roughened.

Figure 7A:
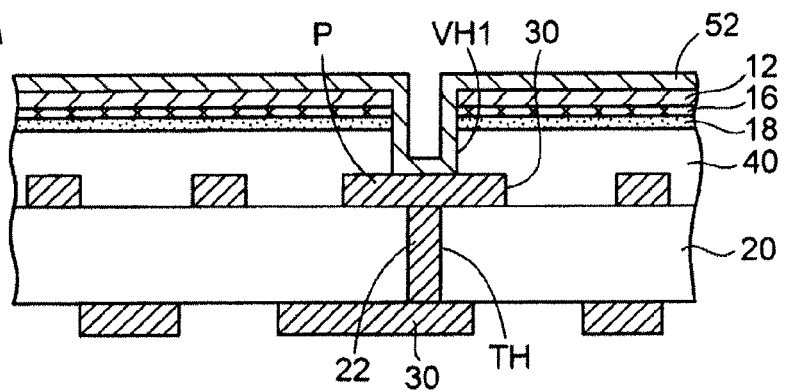
FIGS. 7A to 7C are cross-sectional views illustrating the manufacturing method of the wiring substrate according to the embodiment.

Next, as shown in FIG. 7A, a seed layer 52 made of copper is formed on the copper layer 12 and in the via hole VH1 through electroless plating. The thickness of the seed layer 52 is, for example, about 0.5 μm, and is set to a thickness for reliably covering the inner surface of the via hole VH1. The seed layer 52 may be formed according to a sputtering method instead of the electroless plating.

In this case, as described above, since the copper/tin alloy layer 16 and the copper layer 12 have already been formed on the insulating resin layer 40 via the coupling agent layer 18 with good adhesion, the seed layer 52 is formed on the insulating resin layer 40 via the copper layer 12 or the like with good adhesion.

This is because the seed layer 52 (Cu) cannot provide sufficient adhesion when directly formed on the smooth insulating resin layer 40, but is formed on a metal layer such as the copper layer 12 with good adhesion.

Figure 7B:
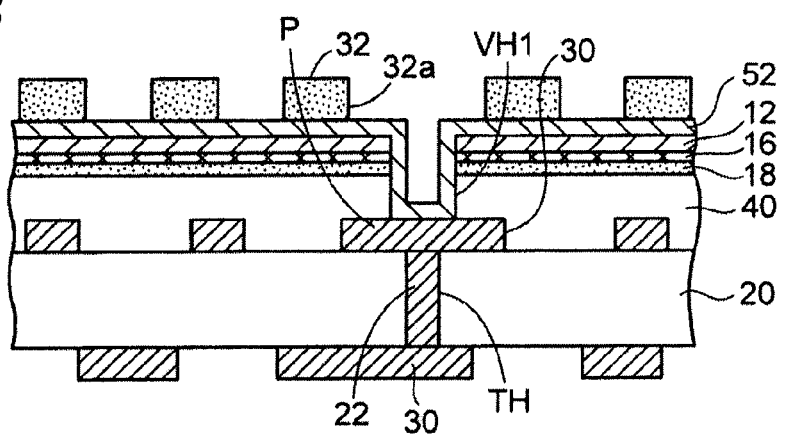

Next, as shown in FIG. 7B, a plating resist 32 in which an opening 32a is provided in a portion (a portion where the wiring layer 200 is disposed) including the via hole VH1 is formed on the seed layer 52 through photolithography. As a method of forming the plating resist 32, a dry film resist may be attached, or a liquid resist is coated so as to be formed.

Figure 7C:
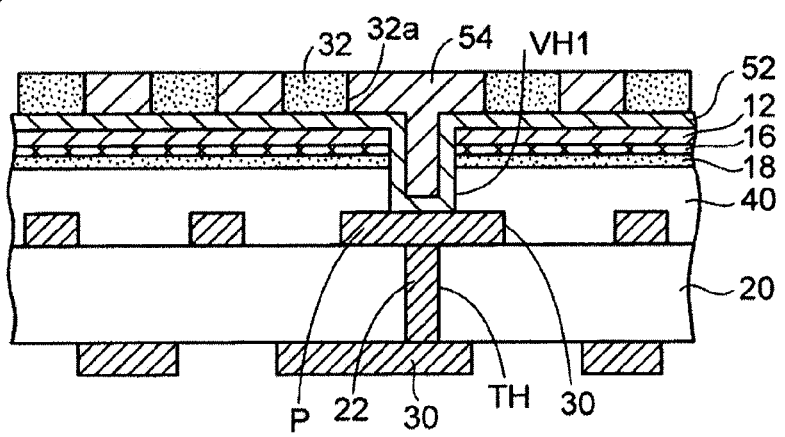

In addition, as shown in FIG. 7C, a metal plating layer 54 made of copper is formed in the via hole VH1 and the opening 32a of the plating resist 32 through electrolytic plating using the seed layer 52 as a plating power supply layer. At this time, the copper layer 12 and the copper/tin alloy layer 16 located under the seed layer 52 are used as a part of the plating power supply layer.

The thickness of the metal plating layer 54 is set to any value so as to obtain desired wire resistance, and is set to about 10 μm to 20 μm, for example, in a case where the line width of the wiring layer 200 is 10 μm. In the via hole VH1, metal plating is performed from the seed layer 52 formed on the inner surface thereof to the inside such that the via hole VH1 is filled with a via conductor.

Figure 8:
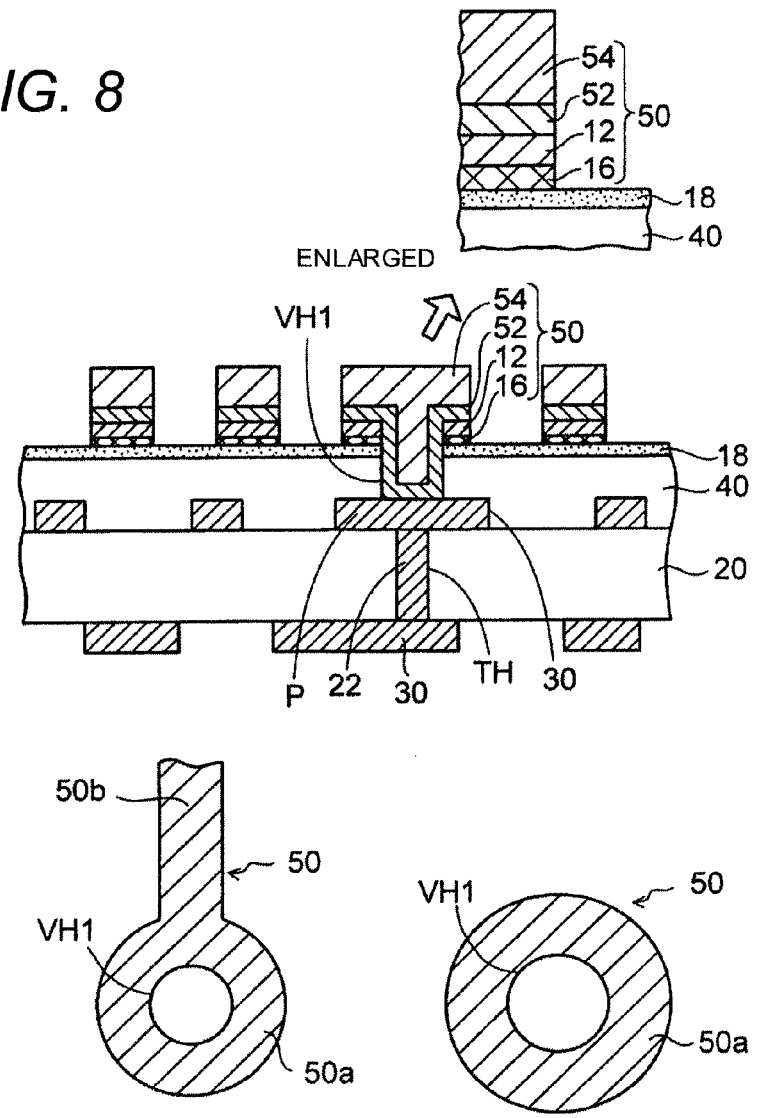
FIG. 8 is a cross-sectional view and a plan view illustrating the manufacturing method of the wiring substrate according to the embodiment.

Successively, as shown in FIG. 8, after the plating resist 32 is removed, the seed layer 52 (Cu) and the underlying copper layer 12 and copper/tin alloy layer 16 are removed through wet etching by using the metal plating layer 54 as a mask. In this case, a nitric acid aqueous solution with the concentration of 10% to 20% is used an etchant of the wet etching, continuous etching is performed from the seed layer 52 (Cu) to the copper/tin alloy layer 16 by the nitric acid aqueous solution.

Thus, a wiring layer 50 composed of the copper/tin alloy layer 16, the copper layer 12, the seed layer 52, and the metal plating layer 54 can be obtained on the insulating resin layer 40 via the coupling agent layer 18. The wiring layer 50 is formed so as to be electrically connected the connection pad P of the lower wiring layer 30 via the via hole VH1 (a via conductor).

In the present embodiment, since the surface of the insulating resin layer 40 is smooth, a residue is hardly generated when the seed layer 52, the copper layer 12, and the copper/tin alloy layer 16 are etched using the semi-additive method.

Thus, it is possible to form the wiring layer 50 with a narrow pitch in which line:space is 10 μm:10 μm to 2 μm:2 μm. In addition, in this case, it is not necessary to excessively perform overetching, and thus the wiring layer 50 does not undergo pattern skip even in a fine pattern.

Further, even if the surface of the insulating resin layer 40 is smooth, the lowermost copper/tin alloy layer 16 of the wiring layer 50 can be tightly adhered to the insulating resin layer 40 by using the coupling agent layer 18.

In this way, the fine wiring layer 50 can be formed on the smooth upper surface of the insulating resin layer 40 with good adhesion. Therefore, unevenness of the wiring layer 50 is also reduced, and thus it is possible to prevent the occurrence of a transmission loss of a high frequency signal.

As shown in the partially enlarged plan view (1) of FIG. 8, if the wiring layer 50 has a pad portion 50a disposed in the via hole VH1 and an extending wiring portion 50b connected thereto and extending outward, the copper/tin alloy layer 16 and the copper layer 12 are disposed in the region of the pad portion 50a (an outer peripheral portion of the via hole VH1) excluding the via hole VH1 and the extending wiring portion 50b as a lowermost layer thereof (diagonal line portion).

Alternatively, as shown in the partially enlarged plan view (2) of FIG. 8, if the wiring layer 50 is disposed in the via hole VH1 as an island-shaped pad portion 50a, the copper/tin alloy layer 16 and the copper layer 12 are disposed in the region of the pad portion 50a excluding the via hole VH1 with a ring shape as a lowermost layer thereof (diagonal line portion).

In the partially enlarged plan views (1) and (2) of FIG. 8, only the via hole VH1 and the wiring layer 50 are schematically shown.

In addition, in the present embodiment, the wiring layer 50 is connected to the lower wiring layer 30 via the via hole VH1, but the wiring layer 50 may be formed on the insulating resin layer 40 in which the via hole VH1 is not formed using the above-described methods. In other words, the wiring layer 50 may be connected to a via hole or may not be connected thereto.

Figure 9A:
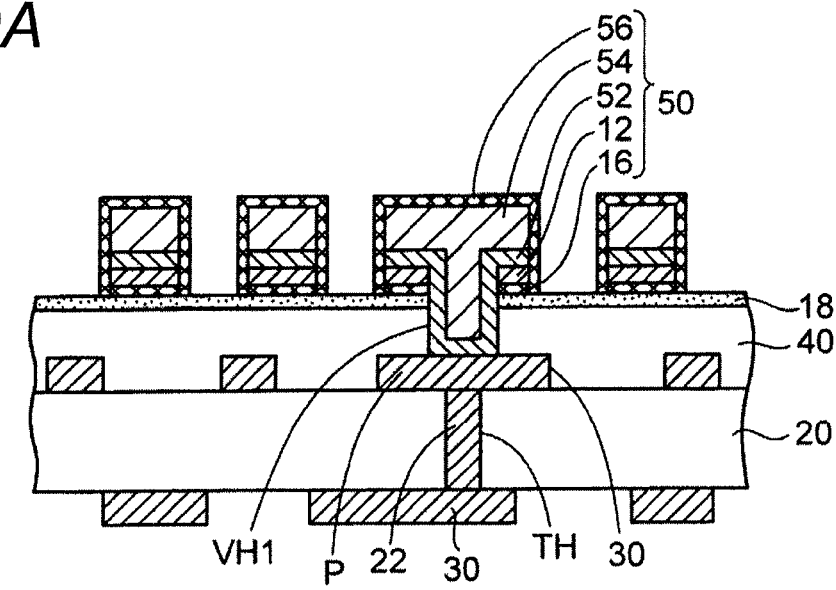
FIGS. 9A and 9B are cross-sectional views illustrating the manufacturing method of the wiring substrate according to the embodiment.

Next, as shown in FIG. 9A, a tin layer is selectively formed on the exposed surfaces (the upper surface and the side surface) of the wiring layer 50 through electroless plating and is then heated, so as to diffuse copper from the wiring layer 50 to the tin layer, thereby obtaining a copper/tin alloy layer 56. The wiring layer 50 is formed so as to further include the copper/tin alloy layer 56 on the upper surface and the side surface thereof.

The wiring layer 50 which is not connected to the via hole VH1 is in a state in which all the outer surfaces (the upper and lower surfaces and both side surfaces) are covered by the copper/tin alloy layers 16 and 56.

Figure 9B:
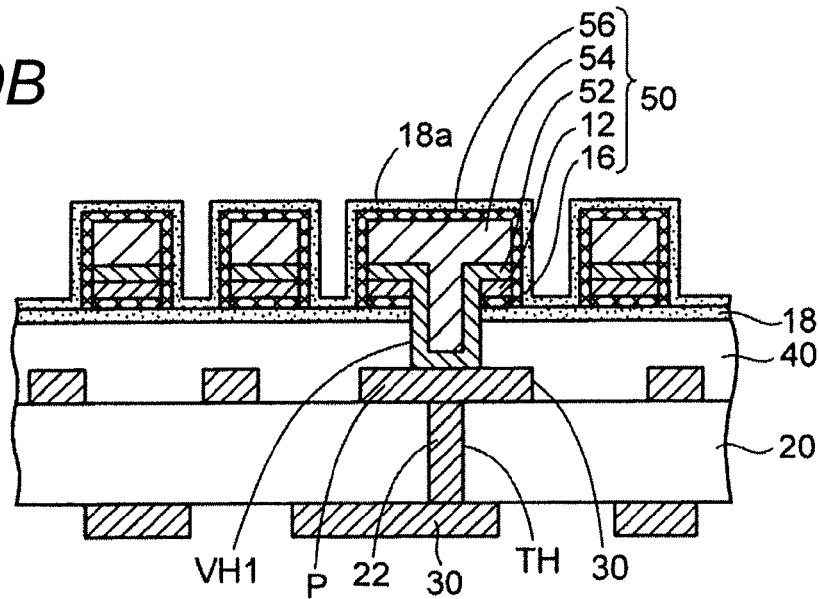

In addition, as shown in FIG. 9B, a coupling agent layer 18a is formed on the wiring layer 50 and the coupling agent layer 18 by using the same method as the above-described method of forming the coupling agent layer 18.

Figure 10A:
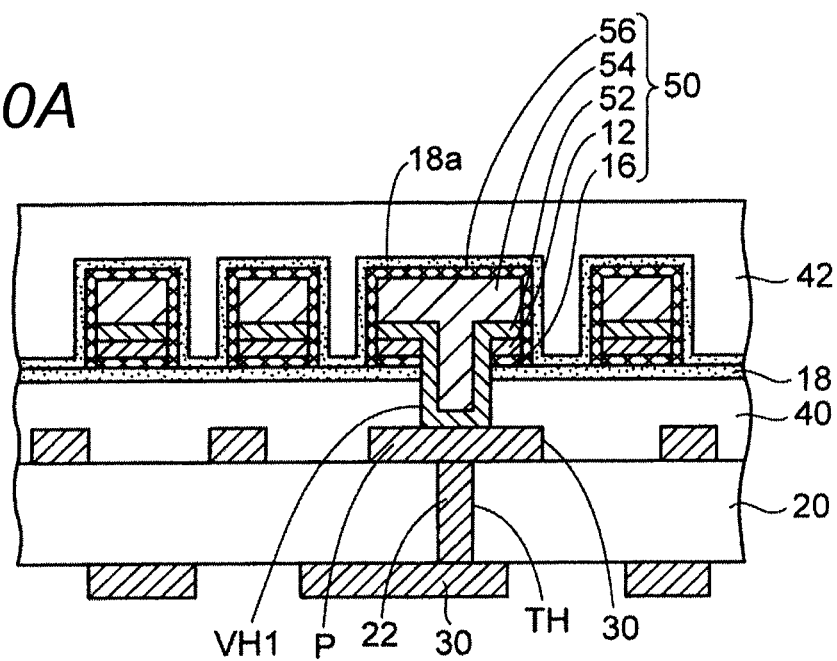
FIGS. 10A and 10B are cross-sectional views illustrating the manufacturing method of the wiring substrate according to the embodiment.

Subsequently, as shown in FIG. 10A, an insulating resin layer 42 is formed on the coupling agent layer 18a which covers the wiring layer 50 by using the same method as the method of forming the insulating resin layer 40.

The insulating resin layer 42 is formed on the copper/tin alloy layer 56 of the wiring layer 50 via the coupling agent layer 18a with good adhesion.

Therefore, the copper/tin alloy layer 16 is tightly adhered to the insulating resin layer 40 via the coupling agent layer 18 on the lower side of the wiring layer 50. In addition, the copper/tin alloy layer 56 is tightly adhered to the insulating resin layer 42 via the coupling agent layer 18a on the upper side and the lateral side of the wiring layer 50.

Figure 10B:
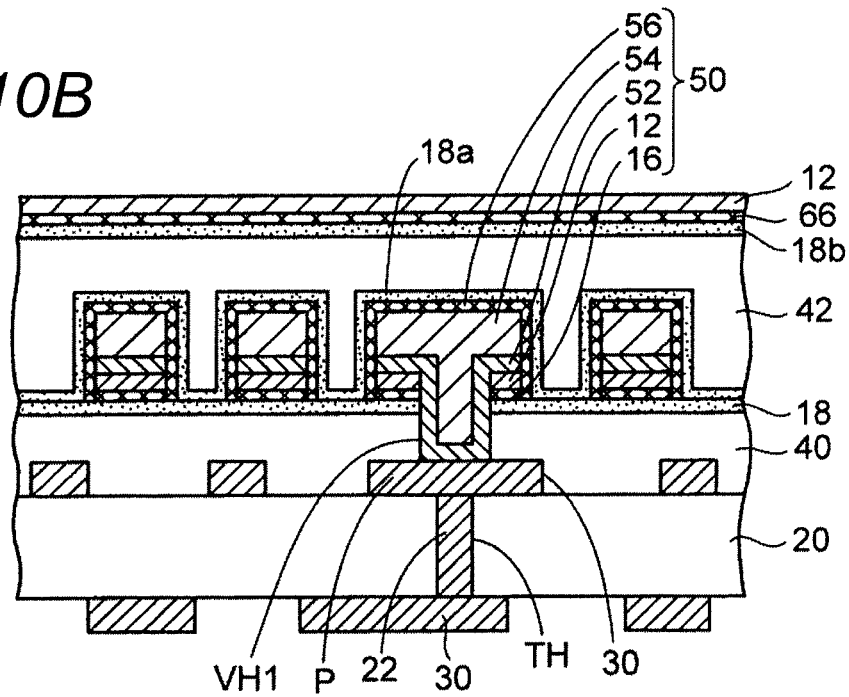

Next, as shown in FIG. 10B, a layered structure is formed in which a coupling agent layer 18b, a copper/tin alloy layer 66, and a copper layer 12 are disposed in this order on the insulating resin layer 42, using the same method as in the steps of FIGS. 4C to 5B according to the embodiment.

Figure 11A:
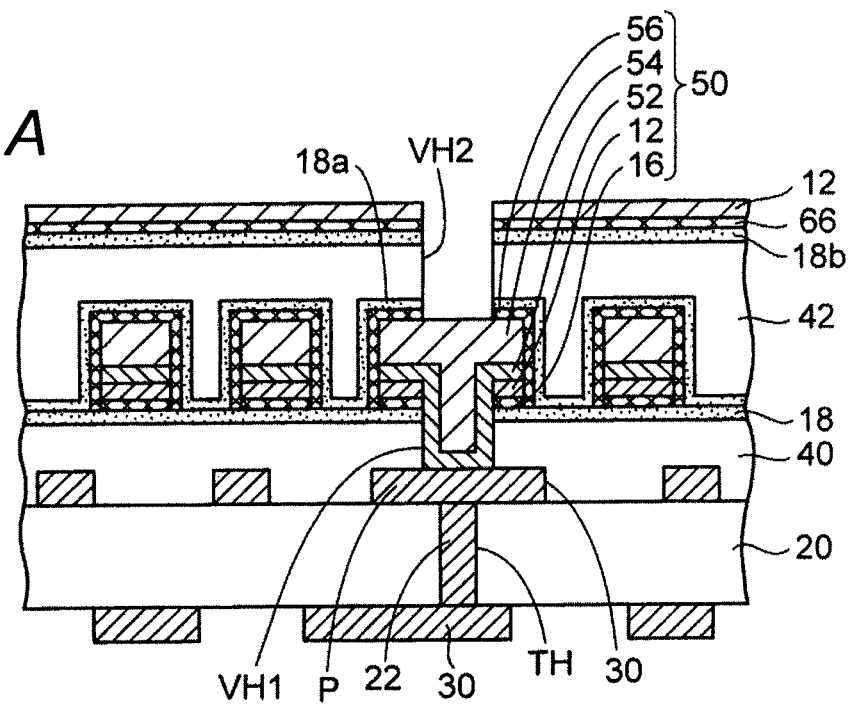
FIGS. 11A and 11B are cross-sectional views illustrating the manufacturing method of the wiring substrate according to the embodiment.

In addition, as shown in FIG. 11A, the copper layer 12, the copper/tin alloy layer 66, the coupling agent layer 18b, the insulating resin layer 42, the coupling agent layer 18a, and the copper/tin alloy layer 56 are processed using a laser. Thus, a via hole VH2 which reaches the metal plating layer 54 of the wiring layer 50 is formed.

Next, a desmear process is performed on the inside of the via hole VH2 using a wet process such as a permanganate method in the same manner as in the above-described step of FIG. 6B. At this time, similarly, since the insulating resin layer 42 is protected from the desmear process by the copper layer 12, the surface of the insulating resin layer 42 is not roughened due to the desmear process.

Next, as a pre-process of electroless plating, the surface of the structure of FIG. 11A is degreased using an alkaline degreasing solution including sodium hydroxide (NaOH) and a surfactant, and the surface is then adjusted using an amine-based surfactant. Thus, the surface of the structure of FIG. 11A is in a state in which palladium used as a catalyst in electroless plating is easily attached thereto.

Figure 11B:
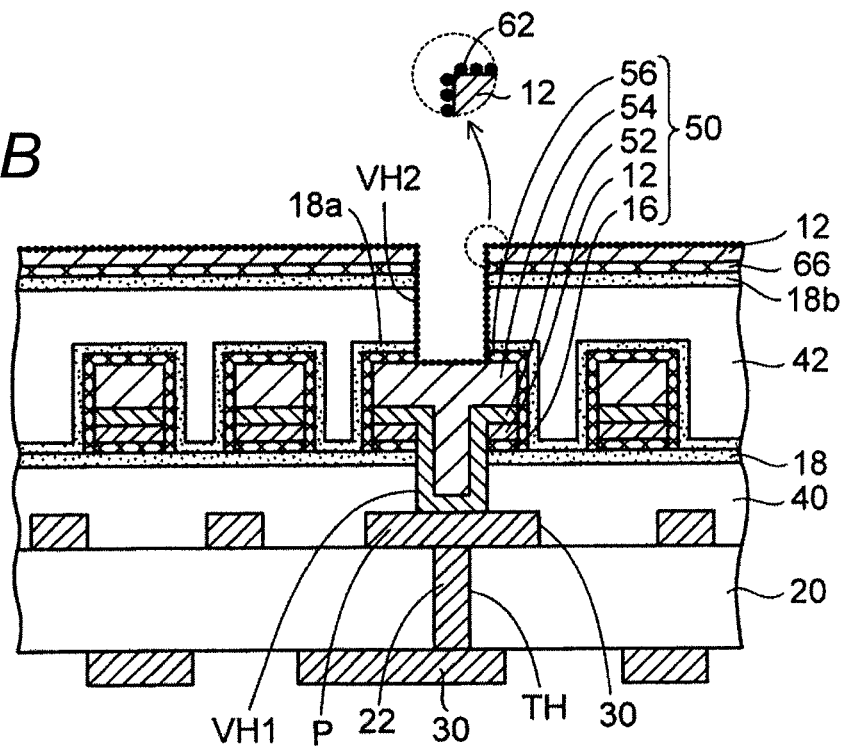

Next, as shown in FIG. 11B, palladium (Pd) 62 is attached to the sidewall and the bottom of the via hole VH2 and the surface of the copper layer 12 as a metal catalyst of the electroless plating. After the structure of FIG. 11A is immersed into an alkaline solution including palladium ions, the palladium 62 can be attached thereto through reduction treatment.

Figure 12A:
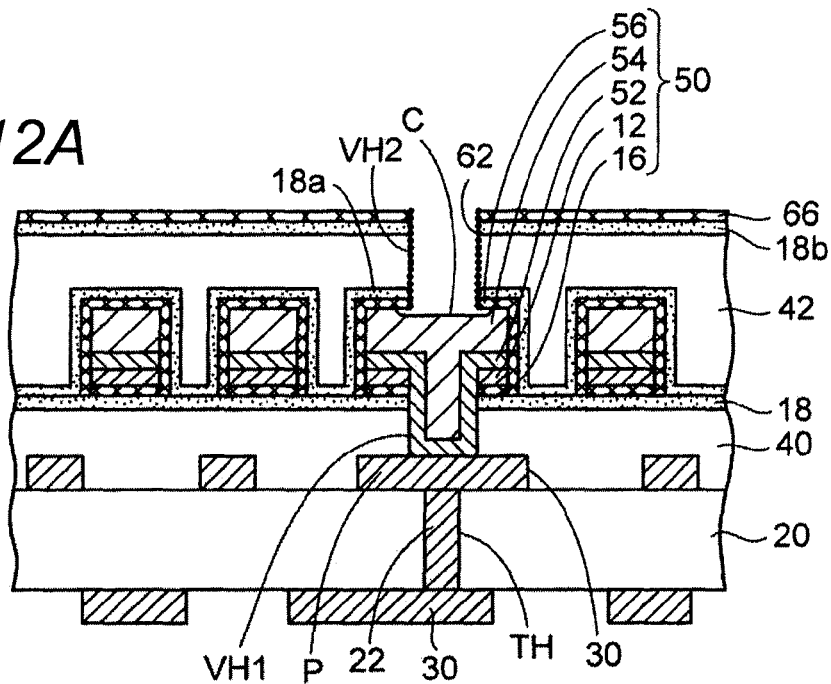
FIGS. 12A and 12B are cross-sectional views illustrating the manufacturing method of the wiring substrate according to the embodiment.

Next, as shown in FIG. 12A, the copper layer 12 is wet-etched using a sodium persulfate aqueous solution. Thus, the palladium 62 attached to the surface of the copper layer 12 is removed along with the copper layer 12. At this time, the metal plating layer 54 (Cu) exposed to the bottom of the via hole VH2 is etched, and the palladium 62 attached to the surface thereof is also removed.

In this way, the palladium 62 attached to the upper part of the copper layer 12 and the bottom of the via hole VH2 is partially removed, and thus the palladium 62 is left only on the sidewall of the via hole VH2.

In addition, the metal plating layer 54 on the bottom of the via hole VH2 is etched such that a recess C is formed in the bottom of the via hole VH2.

In addition, in the example of FIG. 12A, although the copper layer 12 is entirely etched and the surface of the copper/tin alloy layer 66 is exposed, the palladium 62 on the copper layer 12 may be removed, or the copper layer 12 may remain in a film state.

Figure 12B:
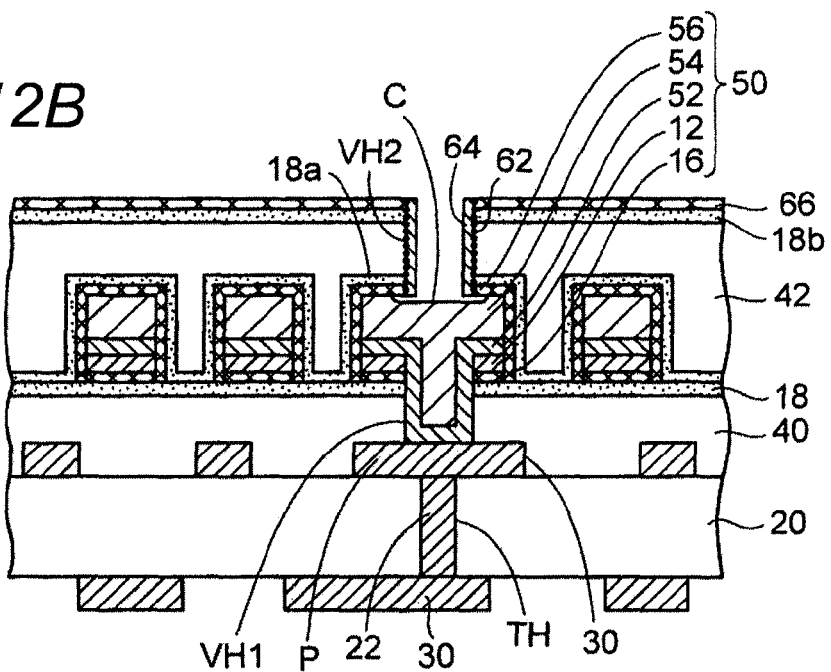

Next, as shown in FIG. 12B, a seed layer 64 is obtained by performing copper plating using the palladium 62 attached to the sidewall of the via hole VH2 as a catalyst through electroless plating using hypophosphorous acid as a reducing agent.

The electroless plating using hypophosphorous acid as a reducing agent has characteristics in which plating is performed on the palladium 62 but is not performed on copper or tin. For this reason, since the palladium 62 is present on the surface of the copper/tin alloy layer 66 and the bottom of the via hole VH2, the seed layer 64 is partially formed only on the sidewall of the via hole VH2.

In the present embodiment, since the seed layer 64 is not formed on the copper/tin alloy layer 66 which is a plating power supply layer in the semi-additive method, the copper/tin alloy layer 66 is maintained in a thin film state. For example, the copper/tin alloy layer 66 is a thin film with the thickness of about 100 nm to 300 nm, and is advantageous when a fine wiring layer is formed according to the semi-additive method.

Figure 13A:
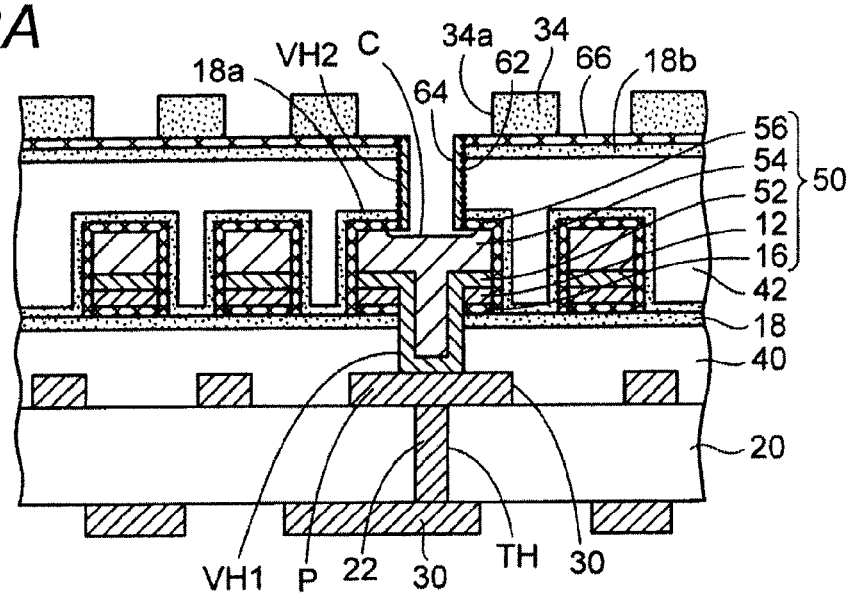
FIGS. 13A to 13C are cross-sectional views illustrating the manufacturing method of the wiring substrate according to the embodiment.
Figure 13B:
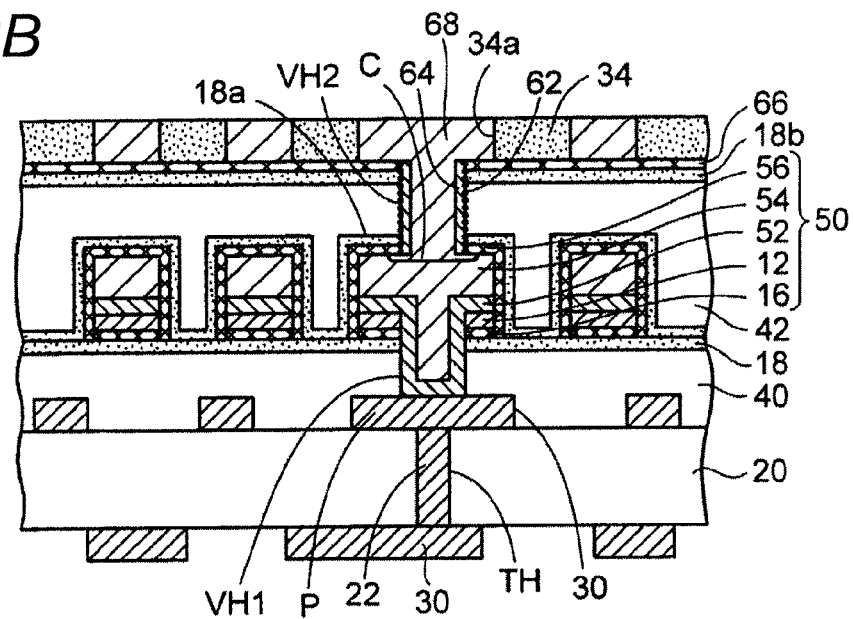

Next, as shown in FIG. 13A, a plating resist 34 in which an opening 34a is provided in a portion where a wiring layer is to be provided is formed on the copper/tin alloy layer 66. In addition, as shown in FIG. 13B, electrolytic plating is performed using the copper/tin alloy layer 66 and the seed layer 64 connected thereto as a plating power supply layer. Therefore, a metal plating layer 68 made of copper is formed in the via hole VH2 and the opening 34a of the plating resist 34.

Figure 13C:
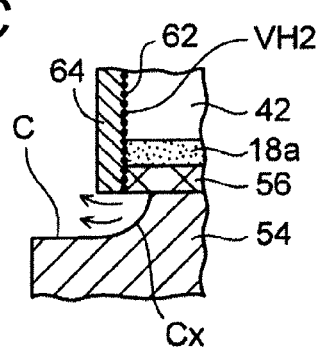

As shown in the partially enlarged view of FIG. 13C, the recess C of the bottom of the via hole VH2 has an undercut portion Cx with a ring shape on the peripheral side at the time immediately before the metal plating layer 68 is formed.

However, the seed layer 64 is electrically connected to the copper/tin alloy layer 56 and the metal plating layer 54 of the wiring layer 50 at the recess C of the bottom of the via hole VH2. For this reason, the copper/tin alloy layer 56 and the metal plating layer 54 also function as a plating power supply layer in electrolytic plating.

Thus, since a plating metal is formed from the inside of the undercut portion Cx of the recess C when electrolytic plating is performed, there is no concern that void may occur in the undercut portion Cx, and the undercut portion Cx is filled with the metal plating layer 68 with high reliability.

Figure 14A:
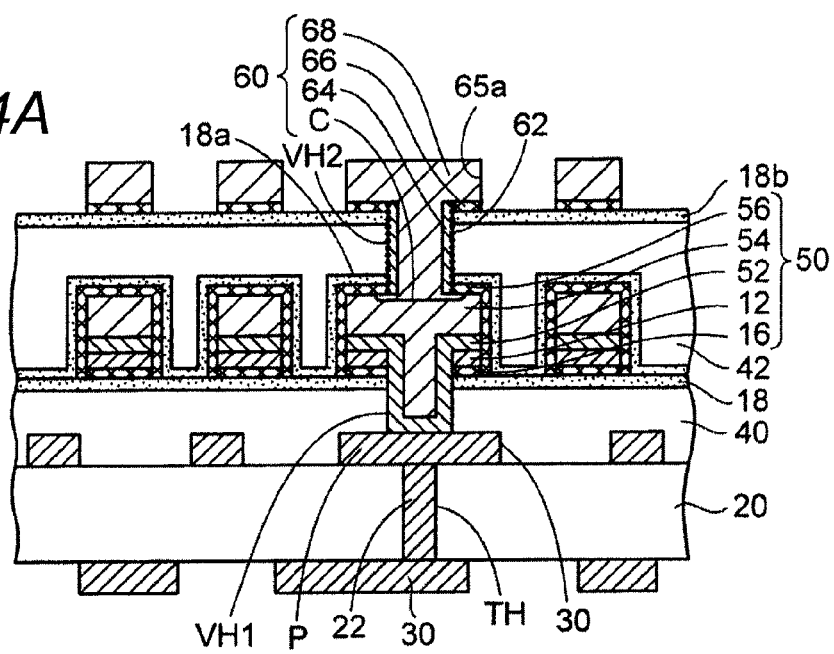
FIGS. 14A and 14B are cross-sectional views illustrating the manufacturing method of the wiring substrate according to the embodiment.

Subsequently, as shown in FIG. 14A, after the plating resist 34 is removed, the copper/tin alloy layer 66 is removed through wet etching by using the metal plating layer 68 as a mask.

Therefore, a wiring layer 60 is formed which includes the seed layer 64 formed on the sidewall of the via hole VH2, and the copper/tin alloy layer 66 and the metal plating layer 68 formed on the insulating resin layer 42 via the coupling agent layer 18b.

At this time, the surface of the insulating resin layer 42 is smooth, and thus a residue is hardly generated when the copper/tin alloy layer 66 is wet-etched using the metal plating layer 68 as a mask.

In addition thereto, since the seed layer 64 is not formed on the copper/tin alloy layer 66, it is not necessary to excessively perform overetching. Therefore, it is possible to form the fine wiring layer 60 with high yield without pattern skip.

Further, even if the surface of the insulating resin layer 42 is smooth, the lowermost copper/tin alloy layer 66 of the wiring layer 60 can be tightly adhered to the insulating resin layer 42 via the coupling agent layer 18b.

In this way, the fine wiring layer 60 can be formed on the smooth upper surface of the insulating resin layer 42 with good adhesion in the same manner as in the wiring layer 50. Therefore, unevenness of the wiring layer 60 is also reduced, and thus it is possible to prevent the occurrence of a transmission loss of a high frequency signal.

In addition, unlike in the present embodiment, in a case where the palladium which is used as a catalyst in electroless plating is attached onto the entire surface, after wiring layers are formed, the palladium remains in a region therebetween. For this reason, it is necessary to perform a palladium removal step in order to prevent an electrical short circuit between the wiring layers.

In contrast, in the present embodiment, the palladium 62 is attached only on the sidewall of the via hole VH2 and is not present in the region between the wiring layers 60, and thus it is possible to omit a step of removing the palladium.

In addition, the palladium 62 and the seed layer 64 are not present in the connection interface between the wiring layer 50 and the wiring layer 60, and the metal plating layer 54 of the wiring layer 50 is directly connected to the metal plating layer 68 of the wiring layer 60. For this reason, it is possible to reduce contact resistance between the wiring layer 50 and the wiring layer 60 using the via hole VH2 as an intermediary and to thereby improve reliability of electrical connection.

Figure 14B:
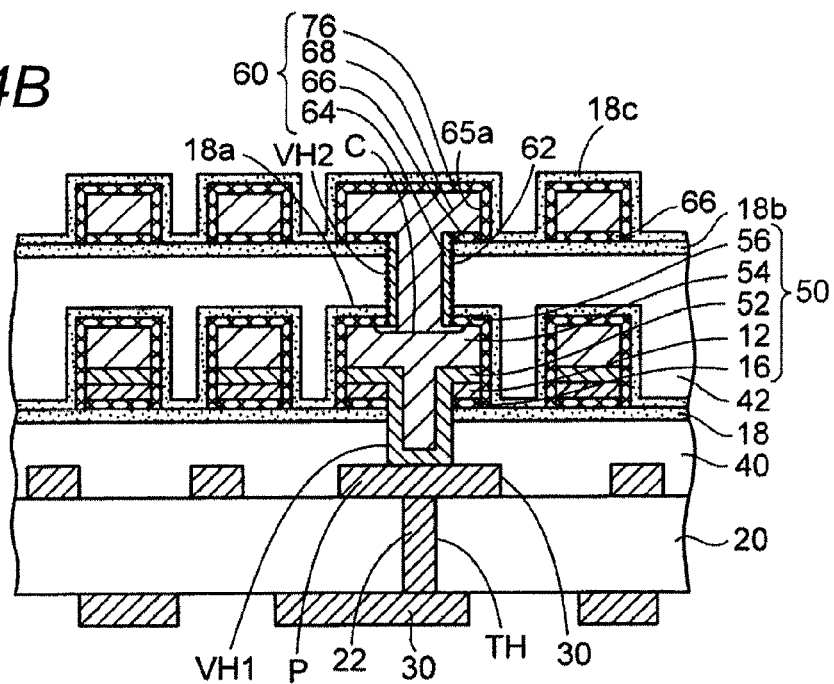

Next, as shown in FIG. 14B, in the same manner as in FIG. 9A described above, a tin layer is selectively formed on the exposed surfaces (the upper surface and the side surface) of the wiring layer 60 through electroless plating. Then, copper is diffused from the wiring layer 60 to the tin layer through a heating process, thereby obtaining a copper/tin alloy layer 76. The wiring layer 60 is formed so as to further include the copper/tin alloy layer 76 on the upper surface and the side surface thereof.

In addition, similarly, as shown in FIG. 14B, a coupling agent layer 18c is formed on the wiring layer 60 and the coupling agent layer 18b by using the same method as the above-described method of forming the coupling agent layer 18.

Next, as shown in FIG. 15A, a solder resist 44 in which an opening 44a is provided in a connection portion of the wiring layer 60 is formed on the coupling agent layer 18c which covers the wiring layer 60. The solder resist 44 is an example of a protective insulating layer formed as an outermost layer.

The solder resist 44 is formed on the copper/tin alloy layer 76 of the wiring layer 60 via the coupling agent layer 18c with good adhesion.

Further, similarly, a solder resist 46 is formed in which an opening 46a is provided on the connection portion of the lower wiring layer 30 on the lower surface side of the core substrate 20.

Next, as shown in FIG. 15B, the coupling agent layer 18c which is exposed inside the opening 44a of the solder resist 44 is etched so as to be removed by using an alkaline-based etchant. Alternatively, the coupling agent layer 18c inside the opening 44a of the solder resist 44 may be etched so as to be removed through plasma etching.

In addition, the copper/tin alloy layer 76 exposed to the opening 44a of the solder resist 44 is etched so as to be removed using an acid etchant. A typical tin removing liquid may be used as an etchant of the copper/tin alloy layer 76.

Thus, the metal plating layer 68 of the wiring layer 60 is exposed to the opening 44a of the solder resist 44 as a connection portion.

In this way, a structure is obtained in which the opening reaching the metal plating layer 68 of the wiring layer 60 is formed in the solder resist 44, the coupling agent layer 18c, and the copper/tin alloy layer 76.

Successively, as shown in FIG. 16, a Ni/Au plating layer is sequentially formed from the bottom on the metal plating layer 68 of the wiring layer 60 of the opening 44a of the solder resist 44 so as to obtain a contact layer 60C.

In addition, a contact layer 30C is formed in the lower wiring layer 30 of the opening 46a of the solder resist 46 on the lower surface side of the core substrate 20 by using the same method.

In this way, the copper/tin alloy layer 76 with relatively high electrical resistance is removed from the connection portion of the wiring layer 60, and thus the metal plating layer 68 made of copper of the wiring layer 60 is directly connected to the contact layer 60C.

In the above-described way, a wiring substrate 2 according to the embodiment can be obtained.

Although, in the above-described form, the wiring layer 50 and the wiring layer 60 are formed using different methods, the wiring layer 50 and the wiring layer 60 may be formed using the same method.

In addition, although two-layer wiring layers are formed on the lower wiring layer 30 formed on the core substrate 20, the number of wiring layers to be layered structured may be set to any value.

In a case where a wiring layer is further formed on the wiring layer 60, in FIG. 16, an insulating resin layer is formed instead of the solder resist 44, and layers including the insulating resin layer to the copper/tin alloy layer 76 are processed using a laser. Thus, a via hole which reaches the metal plating layer 68 of the wiring layer 60 is formed.

In addition, a wiring layer connected to the wiring layer 60 via the via hole is formed. Similarly, a coupling agent layer, a copper/tin alloy layer, and a copper layer may be formed on the insulating resin layer.

In addition, the same wiring layers may be also formed on the lower surface side of the core substrate 20.

As shown in FIG. 16, in the wiring substrate 2 according to the embodiment, the through electrode 22 is provided in the core substrate 20, and the lower wiring layers 30 which are connected to each other via the through electrode 22 are formed on both surface sides.

The insulating resin layer 40 which covers the lower wiring layer 30 is formed on the upper surface side of the core substrate 20. The coupling agent layer 18 is formed on the insulating resin layer 40. The via hole VH1 which reaches the connection pad P of the lower wiring layer 30 is formed in the coupling agent layer 18 and the insulating resin layer 40.

The wiring layer 50 which is connected to the connection pad P of the lower wiring layer 30 via the via hole VH1 (a via conductor) is formed on the insulating resin layer 40 via the coupling agent layer 18.

The wiring layer 50 includes the copper/tin alloy layer 16 which is formed on the outer coupling agent layer 18 from the outer circumference of the via hole VH1, and the copper layer 12 formed on the copper/tin alloy layer 16.

In addition, the wiring layer 50 includes the seed layer 52 which extends from the inner surface of the via hole VH1 to the upper part of the copper layer 12, and the metal plating layer 54 which is formed on the seed layer 52 so as to fill the via hole VH1.

Further, the wiring layer 50 includes the copper/tin alloy layer 56 which covers the side surfaces of the copper/tin alloy layer 16, the copper layer 12, the seed layer 52, and the metal plating layer 54, and the upper surface of the metal plating layer 54.

As such, the wiring layer 50 includes the copper/tin alloy layer 16, the copper layer 12, the seed layer 52, the metal plating layer 54, and the copper/tin alloy layer 56 which covers the exposed surfaces thereof.

In the wiring layer 50, the lowermost copper/tin alloy layer 16 is formed on the smooth insulating resin layer 40 via the coupling agent layer 18 with good adhesion.

Further, the upper surface and the side surface of the wiring layer 50 are covered by the coupling agent layer 18a, and the insulating resin layer 42 is formed on the wiring layer 50 via the coupling agent layer 18a. Thus, the insulating resin layer 42 is tightly adhered to the copper/tin alloy layer 56 of the wiring layer 50 via the coupling agent layer 18a.

In this way, it is possible to obtain sufficient adhesion of the wiring layer 50 with the insulating resin layers 40 and 42 on the upper and lower sides and the lateral side.

In addition, the coupling agent layer 18b is formed on the insulating resin layer 42. The copper/tin alloy layer 66 is formed on the coupling agent layer 18b. Further, the via hole VH2 which reaches the metal plating layer 54 of the wiring layer 50 is formed in the copper/tin alloy layer 66, the coupling agent layer 18b, the insulating resin layer 42, the coupling agent layer 18a, and the copper/tin alloy layer 56.

The recess C is provided in the metal plating layer 54 of the bottom of the via hole VH2, and the recess C has the undercut portion Cx with a ring shape which digs the via hole VH2 outward. In addition, the wiring layer 60 which is connected to the wiring layer 50 via the via hole VH2 (a via conductor) is formed on the insulating resin layer 42 via the coupling agent layer 18b.

The wiring layer 60 includes the seed layer 64 which is formed only on the sidewall of the via hole VH2, and the copper/tin alloy layer 66 which comes into contact with the upper end portion of the seed layer 64 and is formed from the outer circumference of the via hole VH2 to the upper portion of the outer coupling agent layer 18.

In addition, the wiring layer 60 includes the metal plating layer 68 which is formed from the inside of the via hole VH2 to the upper portion of the copper/tin alloy layer 66. The metal plating layer 68 is formed by filling the via hole VH2 including the recess C of the metal plating layer 54 of the wiring layer 50 with a plating metal.

Further, the wiring layer 60 includes the copper/tin alloy layer 76 which is formed from the upper surface of the metal plating layer 68 to the side surfaces of the metal plating layer 68 and the copper/tin alloy layer 66.

The palladium 62 is provided on only the sidewall of the via hole VH2, and the seed layer 64 is formed through electroless plating using the palladium 62 as a catalyst.

As described above, the palladium 62 used as a catalyst in the electroless plating is provided on the interface between the sidewall of the via hole VH2 and the seed layer 64.

On the other hand, the palladium 62 and the seed layer 64 are not present at the interface between the metal plating layer 54 of the wiring layer 50 and the metal plating layer 68 of the wiring layer 60, and both are directly connected to each other. In addition, the palladium 62 and the seed layer 64 are not present at the interface between the copper/tin alloy layer 66 of the wiring layer 60 and the coupling agent layer 18b, and both are directly connected to each other.

The solder resist 44 is formed on the wiring layer 60 and the coupling agent layer 18b via the coupling agent layer 18c. The solder resist 44 is provided with the opening 44a on the connection portion of the wiring layer 60, and the coupling agent layer 18c and the copper/tin alloy layer 76 under the opening 44a are opened.

In addition, the contact layer 60C such as a Ni/Au plating layer is formed in the metal plating layer 68 of the wiring layer 60 inside the opening 44a of the solder resist 44.

In addition, similarly, the solder resist 46 in which the opening 46a is provided on the connection portion of the lower wiring layer 30 is formed on the lower surface side of the core substrate 20. Further, the same contact layer 30C is formed in the lower wiring layer 30 inside the opening 46a of the solder resist 46.

In the wiring substrate 2 according to the embodiment, the wiring layer 50 includes the copper/tin alloy layer 16 as the lowermost layer thereof, and the copper/tin alloy layer 16 is tightly adhered to the smooth insulating resin layer 40 via the coupling agent layer 18.

In addition, similarly, the wiring layer 60 includes the copper/tin alloy layer 66 as the lowermost layer thereof, and the copper/tin alloy layer 66 is tightly adhered to the smooth insulating resin layer 42 via the coupling agent layer 18b.

By using the coupling agent layers and the copper/tin alloy layers, it is possible to form the wiring layers on the smooth insulating resin layers with good adhesion. In addition, since the wiring layers can be formed on the smooth insulating resin layers, a residue is hardly generated when a plating power supply layer is etched in the semi-additive method, and thus a fine wiring layer can be formed with high yield.

In addition, since the wiring layer is formed on the smooth insulating resin layer and thus unevenness of the wiring layer is reduced, it is possible to prevent the occurrence of a transmission loss of a high frequency signal.

Further, in the wiring layer 60, the palladium 62 is partially left only on the sidewall of the via hole VH2, and the seed layer 64 is formed only on the sidewall of the via hole VH2. Therefore, the copper/tin alloy layer 66 which is formed on the insulating resin layer 42 with good adhesion can be connected to the seed layer 64 as a thin plating power supply layer.

For this reason, in the semi-additive method, since a residue is hardly generated when a plating power supply layer (the copper/tin alloy layer 66) is etched and thus it is not necessary to perform excessive overetching, it is possible to form a fine wiring layer with high reliability.

In addition, the palladium 62 and the seed layer 64 are not also present in the bottom of the via hole VH2, and the metal plating layer 54 of the wiring layer 50 and the metal plating layer 68 of the wiring layer 60 come into direct contact with each other. For this reason, it is possible to improve reliability of electrical connection around the via hole VH2.

Figure 17:
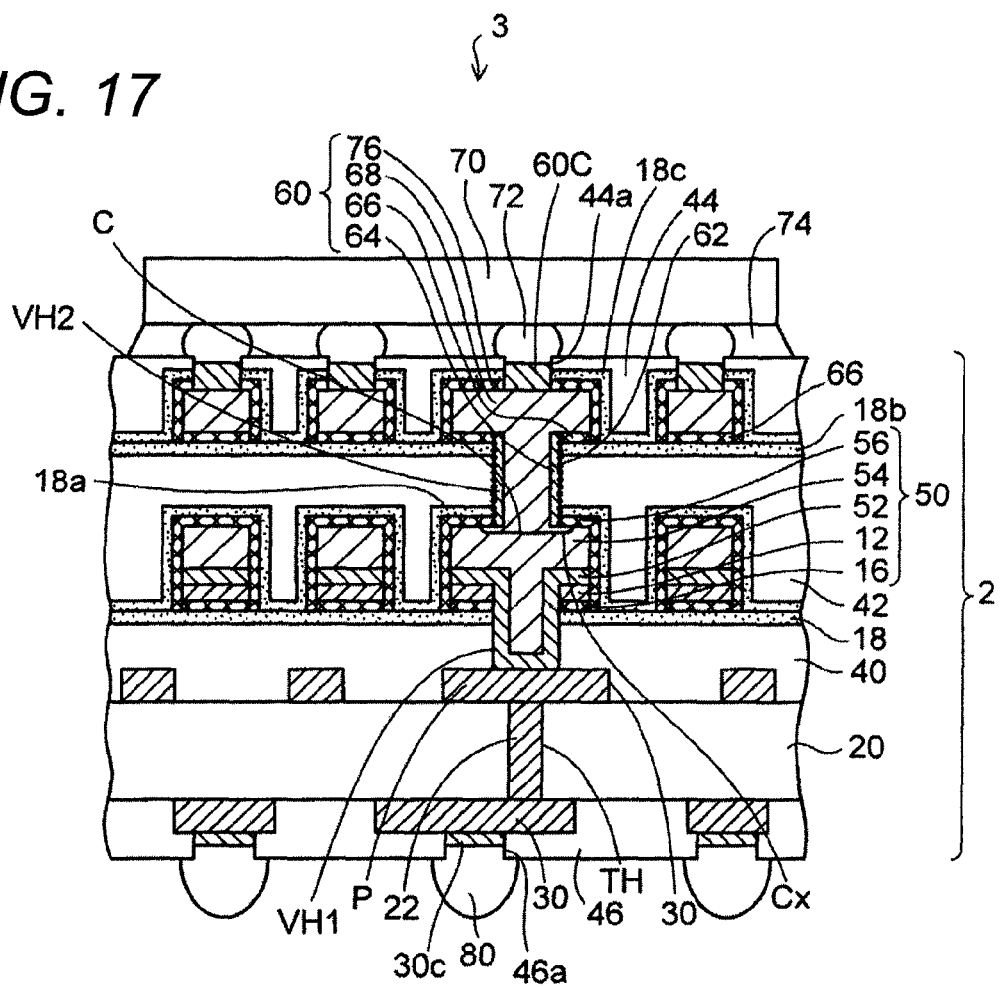
FIG. 17 is a cross-sectional view illustrating a state in which a semiconductor chip is mounted on the wiring substrate of FIG. 16.

FIG. 17 shows a semiconductor device in which a semiconductor chip is mounted on the wiring substrate 2 of FIG. 16. In the semiconductor device 3 shown in FIG. 17, the semiconductor chip 70 (LSI chip) is connected to the contact layer 60C of the wiring layer 60 on the upper surface side of the wiring substrate 2 in a flip chip manner via bump electrodes 72 such as a solder.

In addition, a gap under the semiconductor chip 70 is filled with an under-fill resin 74. Further, an external connection terminal 80 such as a solder ball is provided on the contact layer 30C of the lower wiring layer 30 on the lower surface side.

The wiring substrate 2 according to the present embodiment can be used as a mounting substrate of a high performance semiconductor chip since fine multi-layer wiring layers can be formed with high reliability.

Various aspects of the subject-matter described herein are set out non-exhaustively in the following numbered clauses:

1. A method of manufacturing a wiring substrate comprising:
(a) forming a first insulating layer on a first wiring layer;
(b) providing a layered structure on the first insulating layer, wherein the layered structure comprises: a first coupling agent layer; a first copper/tin alloy layer; and a copper layer, which are disposed in this order;
(c) forming a first via hole which reaches the first wiring layer in a thickness direction from the copper layer to the first insulating layer;
(d) providing a catalyst metal onto an inner surface of the first via hole and the copper layer;
(e) etching the copper layer and a portion of the first wiring layer which is exposed from the first via hole so as to remove the metal catalyst provided onto the copper layer and the first wiring layer while leaving the metal catalyst only on a sidewall of the first via hole;
(f) forming a seed layer on the metal catalyst through electroless plating using the metal catalyst as a catalyst;
(g) forming a plating resist having an opening on the first copper/tin alloy layer (66), wherein the first via hole is exposed from the opening;
(h) filling the opening of the plating resist and the first via hole with a metal plating layer, through an electrolytic plating using the first copper/tin alloy layer and the seed layer as a plating power supply layer;
(i) removing the plating resist; and
(j) etching the first copper/tin alloy layer using the metal plating layer as a mask so as to form a second wiring layer, wherein the second wiring layer comprises the seed layer, the first copper/tin alloy layer, and the metal plating layer.

2. The method of clause 1, further comprising: after the step (j),
(k) forming a second copper/tin alloy layer on an exposed surface of the second wiring layer;
(l) forming a second coupling agent layer on the second copper/tin alloy layer; and
(m) forming a second insulating layer on the second coupling agent layer.

3. The method of clause 2, further comprising:
(n) forming an opening which reaches the metal plating layer of the second wiring layer in a thickness direction of the second insulating layer, the second coupling agent layer, and the second copper/tin alloy layer.

4. The method of clause 1,
wherein, in the step (a), the first wiring layer comprises: a third copper/tin alloy layer on an upper surface and a side surface thereof, and the first insulating layer is formed on the first wiring layer via a third coupling agent layer, and
wherein, in the step (c), the first via hole is formed through the third copper/tin alloy layer and the third coupling agent layer.

5. The method of clause 1,
wherein the step (b) comprises:
(b-1) providing a metal layer transfer base, wherein the metal layer transfer base material comprises: a support body; the copper layer on the support body; the first copper/tin alloy layer on the copper layer; and the first coupling agent layer on the first copper/tin alloy layer,
(b-2) providing the metal layer transfer base material on the first insulating layer such that the first coupling agent layer faces the first insulating layer; and
(b-3) removing the support body from the metal layer transfer base material.

6. The method of clause 5,
wherein the step (b-1) comprises:
(i) forming the copper layer on the support body; and
(ii) forming a tin layer on the copper layer and diffusing copper from the copper layer to the tin layer through a heating process so as to obtain the first copper/tin alloy layer.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A wiring substrate comprising:
a first wiring layer;
a first insulating layer on the first wiring layer;
a first coupling agent layer on the first insulating layer;
a first copper/tin alloy layer on the first coupling agent layer;
a first via hole formed through the first copper/tin alloy layer, the first coupling agent layer, and the first insulating layer to reach the first wiring layer;
a metal catalyst provided on only a sidewall of the first via hole;
a seed layer provided on the metal catalyst and formed only on the sidewall of the first via hole; and
a metal plating layer formed on the first copper/tin alloy layer and the seed layer and filled in the first via hole to contact the first wiring layer.

2. The wiring substrate of claim 1, wherein the first wiring layer is formed with a recess which is communicated with the first via hole, and the metal plating layer is filled in the recess.

3. The wiring substrate according to claim 1, further comprising:
a second copper/tin alloy layer on the metal plating layer
a second coupling agent layer covering the second copper/tin alloy layer; and
a second insulating layer on the second coupling agent layer.

4. The wiring substrate of claim 3, wherein
a second through hole is formed through the second insulating layer, the second coupling agent layer and the metal plating layer such that the metal plating layer is exposed from the second through hole.

* * * * *